United States Patent [19]

Ichikawa

[11] Patent Number: 5,579,980
[45] Date of Patent: Dec. 3, 1996

[54] CHIP BONDING METHOD AND APPARATUS

[75] Inventor: Shigeru Ichikawa, Musashimurayama, Japan

[73] Assignee: Kabushiki Kaisha Shinkawa, Tokyo, Japan

[21] Appl. No.: 279,296

[22] Filed: Jul. 22, 1994

[30] Foreign Application Priority Data

Jul. 26, 1993 [JP] Japan .................................... 5-202484

[51] Int. Cl.⁶ .................................................. H01L 21/50
[52] U.S. Cl. ............................ 228/6.2; 228/49.5; 29/743
[58] Field of Search .................................. 228/1.1, 6.2, 8,
228/44.7, 49.5, 1; 29/740, 743, 840; 219/85.19;
156/556, 558

[56] References Cited

U.S. PATENT DOCUMENTS 4,878,610  11/1989  Mori et al. .............................. 228/49.5

FOREIGN PATENT DOCUMENTS

| 57-63836 | 4/1982 | Japan | 228/6.2 |
| 62-24633 | 2/1987 | Japan | 228/6.2 |
| 62-131529 | 6/1987 | Japan | 228/6.2 |
| 63-53936 | 3/1988 | Japan | 228/6.2 |
| 3129844 | 6/1991 | Japan | 228/6.2 |

*Primary Examiner*—Samuel M. Heinrich
*Attorney, Agent, or Firm*—Koda and Androlia

[57] ABSTRACT

Method and apparatus for removing a chip from a bonding stage of a bonding machine via a vacuum suction of a collet upon exceeding a predetermined heating time so as to avoid thermal damage of the chip. The collet which vacuum-chucks the chip is moved vertically and then circularly by means of a combination of a drive shaft, a cam follower and a cylindrical cam holder so that the vacuum-chucked chip can be returned to the bonding stage or be transferred to other places.

5 Claims, 3 Drawing Sheets

CHIP BONDING METHOD AND APPARATUS

BACKGROUND OF THE INVENTION

1. Field of the Invention

The present invention relates to a chip bonding method and apparatus and more particularly to a method and apparatus for removing a chip from a bonding stage of a bonding machine.

2. Prior Art

When bonding chips, they are vacuum-chucked from a tray for wafers or chips and then placed on a bonding stage. After being heated for a prescribed period of time on this bonding stage, the chips are bonded to lead frames. In this case the bonding stage is moved beneath the lead frame, and upon a bonding request signal (which indicates that the chip on the bonding stage is ready to be bonded) from the control circuit of a chip bonding machine, bonding is actually performed.

The temperature for heating the chips on the bonding stage is approximately 400° to 500° C., and the heating is performed for approximately 10 seconds. If a chip on the bonding stage is heated longer than this heating time, the chip will suffer thermal failure.

Occasionally, a chip is left on the bonding stage for more than a permissible heating time period. There are several reasons for this. In one instance, a chip is left on the bonding stage when bonding detection needs to be redone because of a lead frame detection error. When the heater of the bonding tool that performs the bonding by pressing the lead frames against the chip burns out, the chip is also left on the bonding stage. Thus, chips are left on the bonding stage because when the bonding detection is required and/or when the heater burns out as in the instances described above, the bonding operation of the chip bonding machine is halted. Accordingly, if the chips are to remain on the bonding stage longer than a predetermined heating time, it is necessary to remove the chips from the bonding stage.

FIG. 5 shows one conventional way to remove the chips from a bonding stage. In this Figure, a pusher 62 which is attached to the operating rod of a cylinder 61 is positioned on one side of a bonding stage 60, and a rescue stage 63 is installed so as to face the pusher 62 on the opposite side of the bonding stage 60. If the heating time for a chip 64 placed on the bonding stage 60 has exceeded a prescribed length, the cylinder 61 is actuated and the chip 64 is pushed and removed by the pusher 62 so as to be sent to the rescue stage 63.

In this prior art, the chip 64 on the bonding stage 60 is pushed by the pusher 62. In other words, the chip 64 is caused to slide on the surface of the bonding stage 60 and sent to the rescue stage 63. The result is that the top and bottom surfaces of the chip 64 may be contaminated, chipped or cracked, and reuse of the chip becomes impossible.

In one method to prevent the chipping, cracking, etc., chips are removed by tweezers, thus making a reuse of the chips possible. However, this method is inefficient and results in extremely poor productivity.

SUMMARY OF THE INVENTION

Accordingly, it is a first object of the present invention to provide a chip bonding method and apparatus which removes chips from a bonding stage without causing any damage nor contamination to the chips.

It is a second object of the present invention to provide a chip bonding method and apparatus which removes and then places the chips on a rescue stage so as to secure an elimination and reduction of labor.

In order to accomplish the first object of the present invention, chips placed on the bonding stage are vacuum-chucked by a collet so as to be removed from the bonding stage after a predetermined heating time period.

In addition, the first object is accomplished by a unique structure for a chip rescue device which operates so that chips on the bonding stage are vacuum-chucked by a collet so as to be removed from the bonding stage after a predetermined heating time period.

In order to accomplish the second object of the present invention, the chips which have been removed from the bonding stage are either returned to the bonding stage upon a return request signal from the bonding machine or, in the absence of such a return request signal, placed on a rescue stage.

In addition, the second object of the present invention is accomplished by a unique structure for a chip rescue device that comprises:

a cylindrical cam holder provided with a diagonal groove which is inclined downward from above along the outer circumference of the cam holder and a vertical groove which extends straight and vertically downward from the lower end of the diagonal groove;

a drive shaft installed inside the cam holder in a manner that the drive shaft is capable of making a vertical movement and a rotational movement;

a cam follower attachment fastened to the drive shaft, the cam follower attachment having a cam follower that is movable in the diagonal groove and vertical groove of the cam holder;

a shaft driver which causes the drive shaft to move up and down; and a collet mounted to the lower end of the drive shaft so as to vacuum-chuck a chip placed on a bonding stage.

In the above structure, it is designed so that when the cam follower is at the top end of the vertical groove, the collet is located above the bonding stage.

According to the present invention, the collet comes into contact with the chip, vacuum-chucks the chip, and then remove the chip from the bonding stage. Thus, damages to the chip that is caused by heat can be prevented.

Furthermore, according to the present invention, the chip which has been removed from the bonding stage is brought back to the bonding stage if there is a return request signal from the bonding machine. If there is no such request signal, the chip is released from the collet and placed on the rescue stage. Thus, energy saving during the bonding operation can be assured.

In addition, the drive shaft that has the collet at the bottom moves vertically and rotates by being guided via the diagonal and vertical grooves by means of the shaft driver. Accordingly, the collet at the bottom of the drive shaft can be moved up and down above the bonding stage and also can be moved between the bonding stage and the rescue stage. In other words, the two movements of the collet can be accomplished by a single means which is the shaft driver. Thus, the movements of the collet is obtained by an extremely simple structure.

DETAILED DESCRIPTION OF THE INVENTION

A preferred embodiment of the present invention will be described below with reference to FIGS. 1 through 4.

Figure 4:
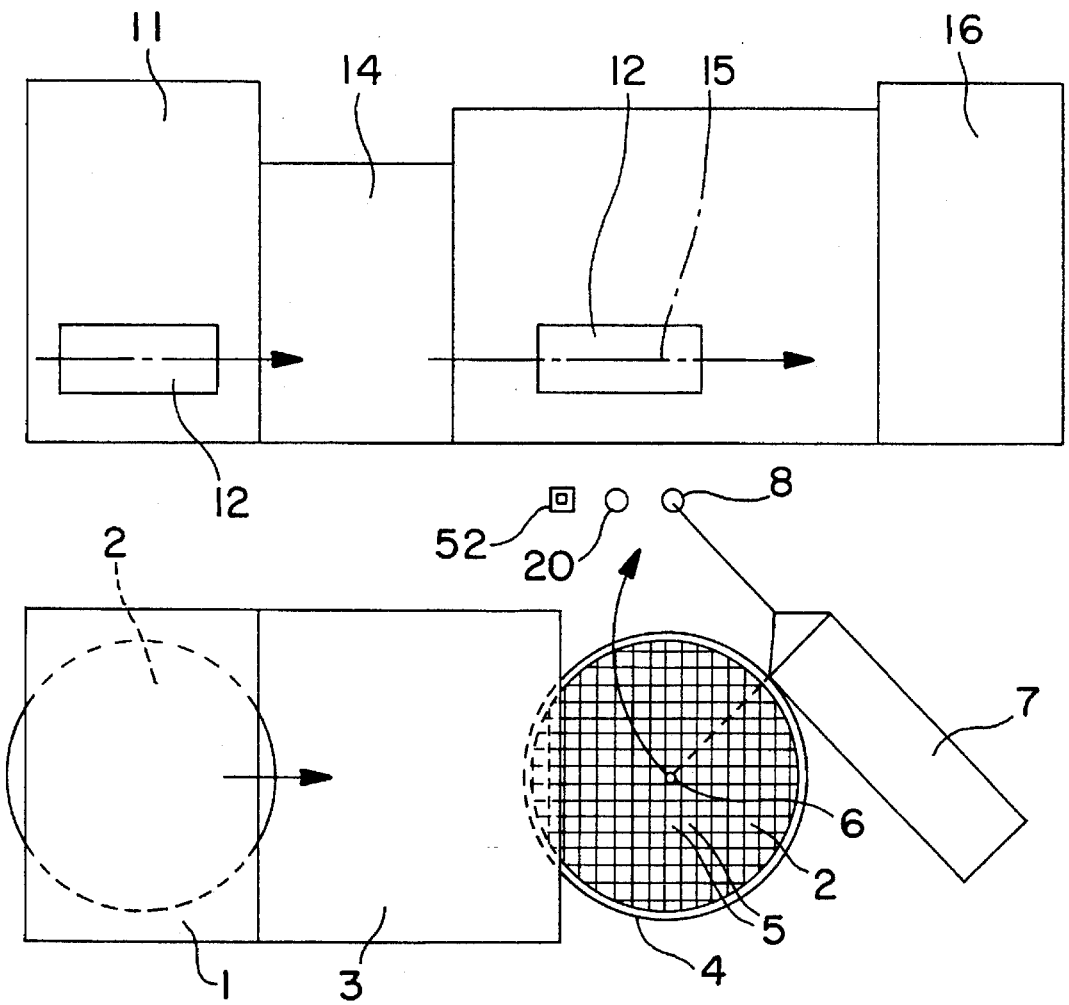
FIG. 4 is an explanatory top view showing the overall structure of a bonding machine.
Figure 5:
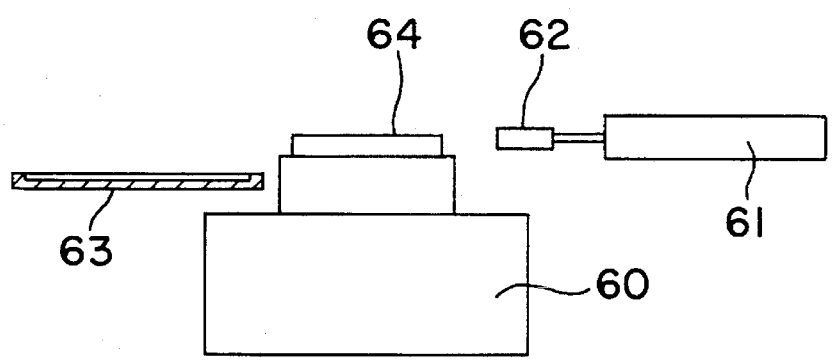
FIG. 5 illustrates a conventional chip-removing device.

First, a brief explanation on the chip bonding machine used with the method and apparatus of the present invention will be presented with reference to FIG. 4.

One of wafers 2 stacked in a wafer loader 1 is fed onto the surface of a wafer stage 4 by a wafer feeder 3. The wafer stage 4 is moved horizontally so that chips 5 that are to be picked up one by one are successively positioned at a pick-up position 6.

A chip 5 at the pick-up position 6 is picked by vacuum suction to the suction port of a transfer head 7 and placed on a bonding stage 8 of a bonding machine. On this bonding stage, the chip 5 is held in place by vacuum suction and heated. When the chip 5 has been placed on the bonding stage, the suction port of the transfer head 7 returns to the pick-up position 6.

Figure 1:
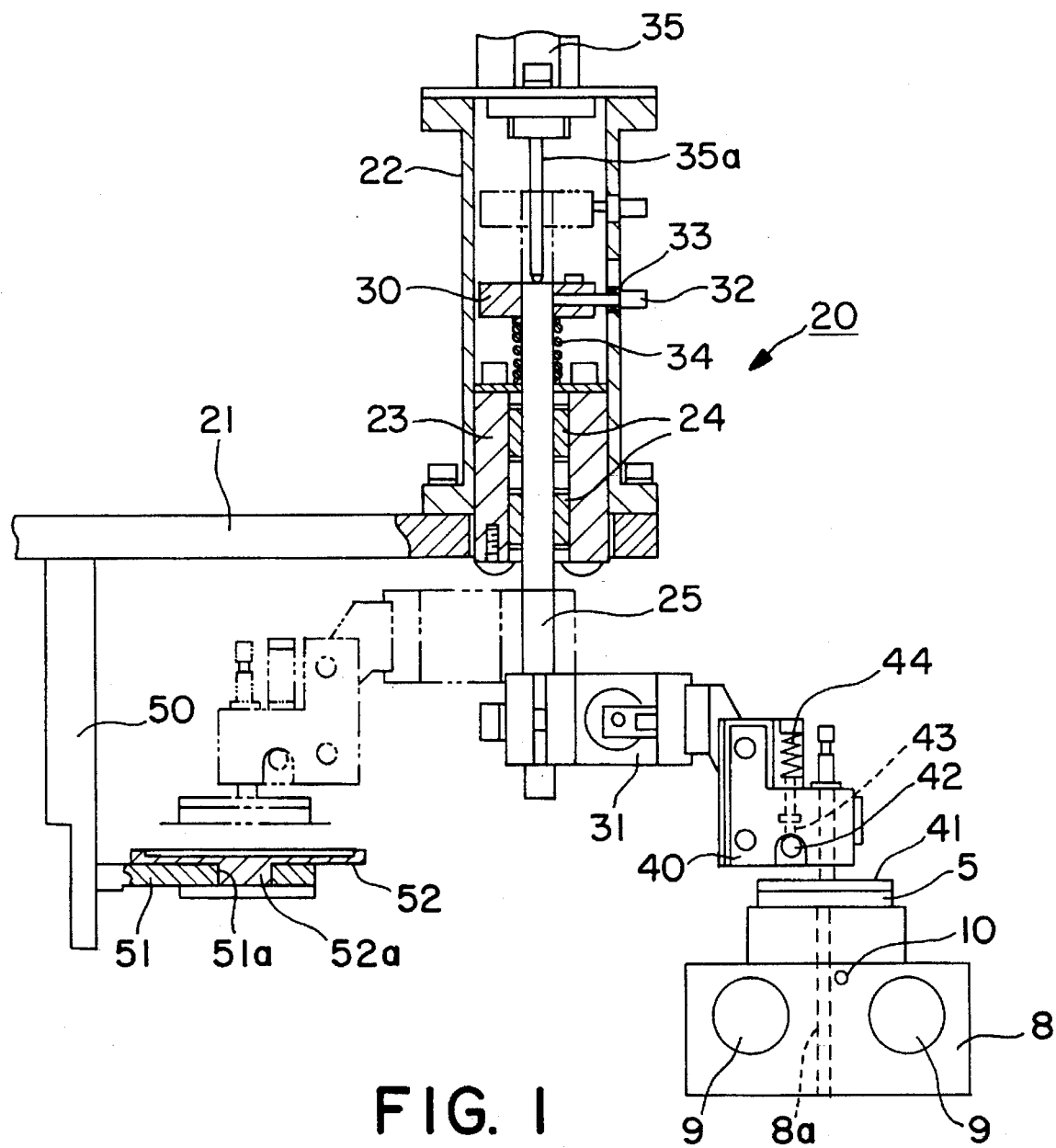
FIG. 1 is a partially sectional front view of one embodiment of the chip rescue device of a bonding machine according to the present invention.

The bonding stage 8 is provided on an XYZ table (not shown) which is movable in horizontal and vertical directions. As seen in FIG. 1, a heater 9 which heats the chip 5 and a temperature detector 10 are provided in the bonding stage 8. The position of the chip 5 on the bonding stage 8 is detected by a camera (not shown) provided above the bonding stage 8. Lead frames 12 stored in a frame loader 11 are sent to a bonding position 15 by a frame feeder (not shown) through a moisture-eliminating oven 14.

While the chip 5 on the bonding stage 8 is being heated to a temperature of 400° to 500° C., any positional discrepancy of the chip 5 is detected by the camera (not shown); and the bonding stage 8 is moved toward the bonding position 15 after the positional discrepancy, if any, has been corrected. The chip 5 held by vacuum suction on the bonding stage 8 is thus positioned beneath the lead frame 12. Then, a bonding tool (not shown) is lowered so that the lead frame 12 is pressed against the chip 5, and bonding is performed. After the bonding, the lead frame 12 is fed by a frame feeder 13 so that the next bonding part of the lead frame is fed to the bonding position, or the bonding stage 8 returns to its original position. When all the bonding have been completed for one lead frame 12 by repeating the above-described operation, the lead frame 12 is sent into a frame unloader 16.

The structure of the chip bonder described above is of the prior art, and the chip rescue method and apparatus of the present invention is installed adjacent to the bonding stage 8 of this type of chip bonding machine.

Figure 2:
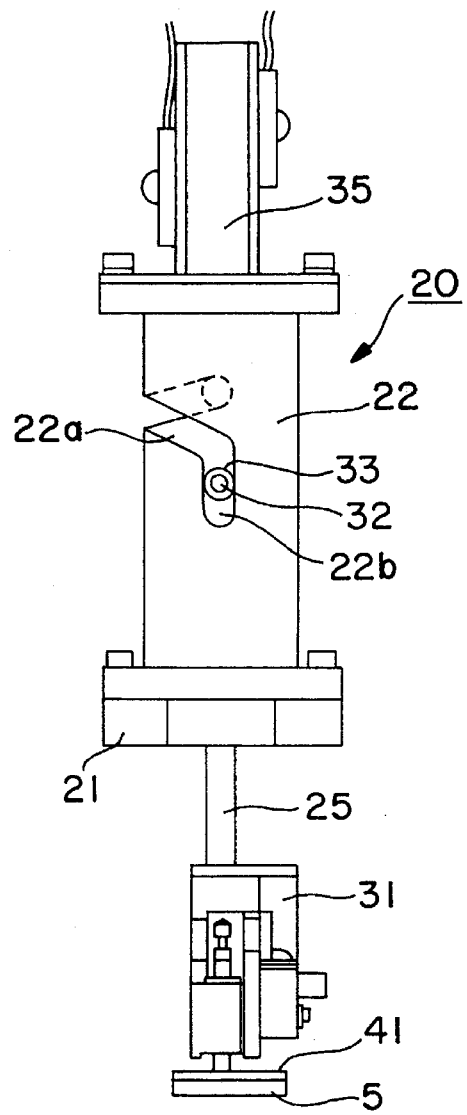
FIG. 2 is a right-side view thereof.

The structure of the chip rescue device 20 will be described in detail with reference to FIGS. 1, 2 and 3.

A cylindrical cam holder 22 is fixed to a supporting plate 21 of a supporting-stand base plate (not shown) of a chip bonding machine. A diagonal groove 22a and a vertical groove 22b are formed in the circumferential wall of the cam holder 22 in a continuous fashion. The diagonal groove 22a runs diagonally with reference to the axis of the cylindrical cam holder 22, and the vertical groove 22b runs parallel to the axis of the cylindrical cam holder 22 so as to extend vertically straight from the lower end of the diagonal groove 22a.

A bush holder 23 is secured in place inside the lower part of the cam holder 22, and a drive shaft 25 is supported in this bush holder 23 via a linear bush 24 so that the drive shaft 25 is capable of making a vertical or axial movement and a rotational movement inside the cam holder 22.

A supporting disk 30 is attached to the upper end of the drive shaft 25, and a collet arm 31 is attached to the lower end of the drive shaft 25. Underneath the supporting disk 30, a spring 34 is provided so that the drive shaft 25 is kept so as to be urged upwardly by the spring 34.

A supporting shaft 32 which is long enough to be in the diagonal groove 22a and vertical groove 22b of the cam holder 22 is fastened to the supporting disk 30, and a cam follower 33 consisting of a bearing is rotatably attached to the supporting shaft 32 so that the cam follower 33 is guided in the diagonal and vertical grooves 22a and 22b. Thus, when the drive shaft 25 is moved in the axial direction, the drive shaft 25 is rotated about its axis because of the movement of the cam follower 33 that is guided by the grooves 22a and 22b.

An air cylinder 35 is provided on the upper surface of the cam holder 22. The lower end of the operating rod 35a of this air cylinder 35 is set to be in contact with the upper end of the drive shaft 25. Thus, when the operating rod 35a protrudes, the drive shaft 25 is pushed by the operating rod 35 so that, by overcoming the spring force of the spring 34, the drive shaft 25 is moved down in the axial direction.

The collet arm 31 attached at the bottom of the drive shaft 25 is set to face the bonding stage 8 when the cam follower 33 is in the vertical groove 22b of the cam holder 22. A collet holder 40 is attached to the collet arm 31 in a manner that the collet holder 40 is movable vertically, and a collet 41 is attached to the collet holder 40. The collet 41 is for vacuum-chucking the chip 5 placed on the bonding stage 8.

A horizontal detection rod 42 is provided in the collet arm 31 with an insulating material (not shown) in between, and a vertical detection rod 43 is provided in the collet holder 40 with an insulating material (not shown) in between.

The collet holder 40 is urged downward by a spring 44 so that the vertical detection rod 43 is pressed against the horizontal detection rod 42. Thus, the vertical detection rod 43 and the horizontal rod 42 are positioned so that they are in contact with each other by the spring 44 but are separable from each other. The detection rods 42 and 43 are connected to a power source (not shown) so that the contact and separation of the two is transmitted to a program circuit (not shown) for the chip rescue device 20.

The supporting plate 21 has a supporting rod 50 which extends downward. A rescue stage holder 51 is provided horizontally to this supporting rod 50, and a rescue stage 52 is placed on the rescue stage holder 51 so that the rescue stage 52 can be pulled out of the rescue stage holder 51 by hand.

Figure 3:
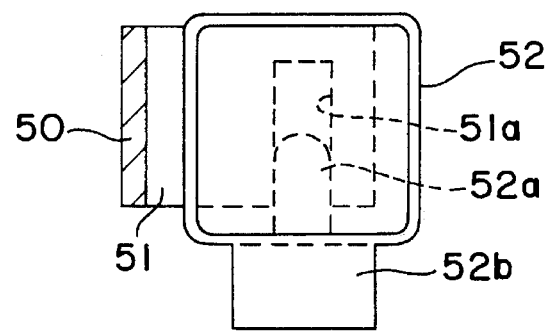
FIG. 3 is a top view thereof.

More specifically, as shown in FIG. 3, a cut-out 51a is formed in the rescue stage holder 51, and a slide projection 52a that can slide inside the recess 51a is formed under the rescue stage 52. The rescue stage 52 is provided with a handle 52b which is used when the rescue stage 52 is pulled out of the stage holder 51.

The rescue stage 52 is positioned so as to be beneath the collet 41 when the cam follower 33 is at the top end of the diagonal groove 22a of the cam holder 22.

The operation of the chip rescue device 20 will be described below.

When bonding is executed on the chip 5, the chip 5 is placed on the bonding stage 8. If the chip remains on the bonding stage over the predetermined heating time (approximately 10 seconds) for reasons as described in the Prior Art section, a timer (not shown) is actuated, and the cylinder 35 of the chip rescue device 20 is actuated by a command signal from the control circuit of the bonding machine.

The operating rod 35a of the cylinder 35 is ordinarily retracted. In other words, the drive shaft 25 is pushed upward by the spring 34 so that the cam follower 33 is at the top end of the diagonal groove 22a of the cam holder 22. Thus, the collet 41 at the bottom of the drive shaft 25 is located above the rescue stage 52 as shown by the two-dot chain line in FIG. 1.

When the air cylinder 35 is actuated and the operating rod 35a protrudes, the drive shaft 25 is pushed downward by the operating rod 35a. As a result, the cam follower 33 moves downward guided by the diagonal groove 22a of the cam holder 22, and the drive shaft 25 is lowered while being rotated. Thus, the collet 41 moves on a circular path from its position above the rescue stage 52. When the cam follower 33 has moved to the lower end of the diagonal groove 22b, the collet is located directly above the bonding stage 8.

Afterward, the cam follower 33 is lowered by being guided by the vertical groove 22b of the cam holder 22, so that the collet 41 is lowered straight without making any rotation. When the collet 41 has been lowered and comes into contact with the surface of the chip 5 which is placed on the bonding stage 8, the lowering motion of the collet 41 is stopped. The drive shaft 25 and collet arm 31 are further lowered by a small amount, and the horizontal detection rod 42 is separated from the vertical detection rod 43. When the two detection rods are separated, electric current no longer flows in these rods 42 and 43, and it is detected that the collet 41 has contacted the chip 5. As a result of this detection, the vacuum suction of the collet 41 is initiated by the control circuit (not shown). At the same time, the vacuum of the bonding stage 8 is stopped and air is discharged from the bonding stage 8. Accordingly, the chip 5 is chucked by the collet 41 by vacuum suction.

Once the chip 5 has been held by the collet 41 via vacuum suction, the air cylinder 35 is switched off, so that the operating rod 35a is retracted. When the operating rode 35a is retracted, the drive shaft 25 is pushed up by the spring 34. When the drive shaft 25 is pushed upward by the spring 34, the cam follower 33 is moved up by being guided by the vertical groove 22b of the cam holder 22. Thus, the drive shaft 25 is moved upward and rotated by being guided by the diagonal groove 22a. As a result, the collet 41 is removed from the bonding stage and moved to the position above the rescue stage 52.

When the collet 41 has been moved to above the rescue stage 52, one of the following two operations is performed:

The first operation (called "Operation A") is an operation to transfer the chip 5 to the rescue stage 52. In this Operation A, the vacuum-chucking of the collet 41 is cut off, and then air is discharged, so that the chip 5 is released onto the rescue stage 52. When the chip 5 is transferred on the rescue stage 52, the rescue stage 52 is pulled out of the rescue stage holder 51 by grasping the handle 52b of the rescue stage 52 by hand.

The second operation (called "Operation B") is an operation to return the chip 5 to the bonding stage 8. In this Operation B, the collet 41 keeps the chip 5 thereon "as is" by vacuum suction, and the cylinder 35 is actuated upon a request signal (or a return request signal) for the chip 5. When the cylinder 35 is actuated upon the request signal, the drive shaft 25 is rotated while being rotated so that the collet 41 is positioned above the bonding stage 8 and then lowered straight. As a result, the chip 5 on the collet 41 comes into contact with the bonding stage 8. The detection signal of this contact is caused by the two rods 42 and 43 and shuts off the vacuum suction of the collet 41 and also initiates the vacuum suction of the bonding stage 8. Thus, the chip 5 is released back onto the bonding stage 8. Afterward, the cylinder 35 is switched off, and the collet 41 with no chip vacuum-chucked thereto is returned via the sprint force of the spring 34 to the position indicated by the two-dot chain line in FIG. 1.

In this case, the chip 5 which has been vacuum-chucked from the bonding stage 8 by the collet 41 is returned to the bonding stage 8 "as is", the chip 5 can be returned precisely where it was. Once the chip 5 has thus been placed on the bonding stage 8, the bonding operation is resumed.

Which operation described above should be performed is determined in advance by setting the desired operation in the control circuit. As described in the Prior Art section, the bonding operation of the bonding machine is halted in abnormal situations; and in such cases only the chip rescue device 20 is operated.

With this in mind, there can be three different ways to determine which operation should be performed depending upon the following situations:

1. The first is to execute Operation A every time a chip is vacuum-chucked by the collet 41.
2. The second is to execute Operation B upon a return request signal (a signal indicating that the operator has released the reset of the chip bonding machine and switched the starting switch on) from the chip bonding machine. In this case, the chip 5 is vacuum-chucked by the collet 41 and waits above the rescue stage 52 until the return request signal is supplied.
3. The third is to execute Operation A when there is no return request signal from the chip bonding machine after a given period of time has elapsed or to execute Operation B when there is a request signal from the chip bonding machine within the given period of time. When Operation B is executed, the chip 5 is vacuum-chucked by the collet 41 and waits above the rescue stage 52.

In the above structure and operation, when the collet 41 comes into contact with the chip 5, the driving force of the spring 44 can work as a cushion. Thus, the contact of the collet 41 with the chip 5 does not cause any damage to the chip 5. The load applied by the collet 41 onto the chip 5 is determined by the spring force of the spring 44. Damages to the chip 5 can be well prevented by adjusting the spring force of the spring 44 to approximately 100 g or less.

The collet 41 is moved up and down and also moved between the bonding stage 8 and the rescue stage 52. During these movements, the chip 5 vacuum-chucked by the collet 41 can be maintained "as is" on the collet 41 and returned to the original position of the bonding stage 8. Accordingly, the number of chips 5 dropped onto the rescue stage 52 can be reduced, and removing and transferring operation of the chip can be performed smoothly and accurately.

In addition, the vertical movement and rotational movement of the collet 41 are accomplished by means of the diagonal groove 22a and the vertical groove 22b of the cam holder 22 via the drive shaft 25 that is moved vertically by a single driving means which is in the embodiment the air cylinder 35. Thus, the vertical and rotational movements of the collet 41 can be performed by a simple structure.

Furthermore, the rescue stage 52 is constructed so that it can be pulled out of the rescue stage holder 51 by hand. Accordingly, the removal of the chip 5 from the rescue stage 52 can be done easily.

In the above, the description of the invention is given with reference to the chip 5 transferred to the bonding stage 8 from the wafer 2. However, it goes without saying that the present invention can be applied for chips accommodated in a tray (instead of the wafer 2) which are transferred to the bonding stage 8.

If an XY table is installed instead of the rescue stage holder 51 and rescue stage 52, a tray is placed on the XY table so that the chips 5 are placed in the tray. Thus, in this case, there is no need for manually removing the chips from the rescue stage, and the working characteristics can be improved.

As seen from the above, according to the present invention, chips are vacuum-chucked by a collet and removed from the bonding stage. Accordingly, the chips are prevented from damage and contamination. In addition, the chips removed from the bonding stage can be returned to the bonding stage upon return request signals or, in the absence of such request signals, released onto a rescue stage. Accordingly, an elimination or reduction of labor can be assured. Furthermore, the collet can be lifted vertically above the bonding stage and moved back and forth between the bonding stage and the rescue stage by means of an extremely simple structure.

I claim:

1. A chip bonding apparatus in which a chip which has been transferred from a pickup position to a bonding stage is heated at said bonding stage for a predetermined time period before being bonded to a lead frame, said apparatus including a chip rescue device which comprises a rescue stage; a collet for vacuum-chucking said chip; a transferring means for automatically transferring said vacuum-chucked chip from said bonding stage to said rescue stage when actuated; and a timer means for actuating said transferring means after a predetermined heating time has expired.

2. A chip bonding apparatus in which a chip on a bonding stage is heated for a predetermined time period before being bonded to a lead frame, said apparatus including a chip rescue device which comprises a collet for vacuum-chucking said chip and a transferring means for transferring said vacuum-chucked chip from said bonding stage to a rescue stage after a predetermined time period has expired and wherein said chip rescue device comprises:

a cylindrical cam holder provided therein with a diagonal groove and a straight groove formed continuously, said vertical groove extending from one end of said diagonal groove;

a drive shaft rotatably installed in said cylindrical cam holder in an axial direction of said cylindrical cam holder, said drive shaft being movable in an axial direction of said drive shaft;

a shaft driving means provided on said cam holder for moving said drive shaft in a direction of said drive shaft;

a cam follower provided on said drive shaft, said cam follower being movable in said diagonal and vertical grooves of said cam holder so that said drive shaft is rotated when said cam follower is moved in said diagonal and vertical grooves; and a collet attached to a lower end of said drive shaft, said collet vacuum-chucking said chip and moved circularly between said bonding stage and rescue stage when said drive shaft is rotated by said cam follower moved in said diagonal and vertical grooves.

3. A chip bonding apparatus according to claim 2, wherein said collet is movable up and down together with a collet arm provided on said drive shaft, and said chip rescue device further comprises a detection means for detecting a lowered position of said collet where said collet is in contact with said chip on said bonding stage and where said vacuum-chucked chip is in contact with said bonding stage.

4. A chip bonding apparatus according to claim 3, wherein said rescue stage which receives a chip transferred while being vacuum-chucked by said collet from said bonding stage is provided adjacent to said bonding stage, said rescue stage being pulled out of a rescue stage holder.

5. A chip bonding apparatus in which a chip on a bonding stage is heated for a predetermined time period before being bonded to a lead frame, said apparatus including a chip rescue device which comprises a collet for vacuum-chucking said chip and a transferring means for transferring said vacuum-chucked chip from said bonding stage to a rescue stage after predetermined heating time has expired and wherein said chip rescue device comprises:

a cylindrical cam holder provided therein with a diagonal groove and a straight groove formed continuously, said vertical groove extending from one end of said diagonal groove;

a drive shaft rotatably installed in said cylindrical cam holder in an axial direction of said cylindrical cam holder, said drive shaft being movable in an axial direction of said drive shaft;

a shaft driving means provided on said cam holder for moving said drive shaft in a direction of said drive shaft;

a cam follower provided on said drive shaft, said cam follower being movable in said diagonal and vertical grooves of said cam holder so that said drive shaft is rotated when said cam follower is moved in said diagonal and vertical grooves; and a collet attached to a lower end of said drive shaft, said collet vacuum-chucking said chip and moved circularly between said bonding stage and rescue stage when said drive shaft is rotated by said cam follower moved in said diagonal and vertical grooves; and wherein said rescue stage which receives a chip transferred while being vacuum-chucked by said collet from said bonding stage is provided adjacent to said bonding stage, said rescue stage being pulled out of a rescue stage holder.

* * * * *